US010268865B2

(12) United States Patent
Sun et al.

(10) Patent No.: US 10,268,865 B2
(45) Date of Patent: Apr. 23, 2019

(54) ULTRASONIC FINGERPRINT SENSOR AND MANUFACTURING METHOD OF THE SAME

(71) Applicant: NANCHANG O-FILM BIO-IDENTIFICATION TECHNOLOGY CO., LTD., Nanchang (CN)

(72) Inventors: Wensi Sun, Nanchang (CN); Anpeng Bai, Nanchang (CN)

(73) Assignee: NANCHANG O-FILM BIO-IDENTIFICATION TECHNOLOGY CO., LTD., Nanchang (CN)

(*) Notice: Subject to any disclaimer, the term of this patent is extended or adjusted under 35 U.S.C. 154(b) by 44 days.

(21) Appl. No.: 15/489,888

(22) Filed: Apr. 18, 2017

(65) Prior Publication Data
US 2018/0068151 A1 Mar. 8, 2018

(30) Foreign Application Priority Data

Sep. 5, 2016 (CN) .......................... 2016 1 0802318
Sep. 5, 2016 (CN) ..................... 2016 2 1037973 U

(51) Int. Cl.
G06K 9/28 (2006.01)
G06K 9/00 (2006.01)
H01L 41/29 (2013.01)
H01L 41/37 (2013.01)
H01L 41/08 (2006.01)
(Continued)

(52) U.S. Cl.
CPC ....... *G06K 9/0002* (2013.01); *G06K 9/00053* (2013.01); *H01L 41/0825* (2013.01); *H01L 41/183* (2013.01); *H01L 41/29* (2013.01); *H01L 41/333* (2013.01); *H01L 41/37* (2013.01)

(58) Field of Classification Search
CPC ... G06K 9/0002; H01L 41/08–41/1138; Y10T 29/42; G01N 29/245
See application file for complete search history.

(56) References Cited

U.S. PATENT DOCUMENTS 6,829,950 B2 * 12/2004 Ganapathi ............ G06K 9/0002
73/862.046
7,514,842 B2 * 4/2009 Scott .................... G06K 9/0002
310/316.01
(Continued)

Primary Examiner — Brian Werner
(74) Attorney, Agent, or Firm — Hodgson Russ LLP

(57) ABSTRACT

The present disclosure provides a manufacturing method of an ultrasonic fingerprint sensor. The method includes steps of: etching a plurality of through holes arranged in an array on an insulating substrate to form a frame; filling piezoelectric material into the through holes to form a plurality of piezoelectric posts corresponding to the plurality of through holes. The present disclosure also provides an ultrasonic fingerprint sensor. In the ultrasonic fingerprint sensor and the manufacturing method of the same according to the embodiment of the present disclosure, the frame is formed on the insulating substrate by etching, and the piezoelectric material is filled in the frame to form the piezoelectric posts to form the ultrasonic fingerprint sensor. The cost of the ultrasonic fingerprint sensor can be reduced because the etching apparatus is low-cost and the process is simple.

18 Claims, 13 Drawing Sheets

(51) Int. Cl.
*H01L 41/18* (2006.01)
*H01L 41/333* (2013.01)

(56) References Cited

U.S. PATENT DOCUMENTS

| | | | | |
|---|---|---|---|---|
| 8,085,998 | B2 * | 12/2011 | Setlak | G06K 9/00053 |
| | | | | 257/226 |
| 9,607,203 | B1 * | 3/2017 | Yazdandoost | A61B 5/1172 |
| 2001/0042291 | A1 * | 11/2001 | Esashi | H01L 41/37 |
| | | | | 29/25.35 |
| 2003/0102777 | A1 * | 6/2003 | Kuniyasu | B06B 1/0629 |
| | | | | 310/334 |
| 2010/0068697 | A1 * | 3/2010 | Shih | G01N 29/022 |
| | | | | 435/5 |
| 2013/0270967 | A1 * | 10/2013 | Dausch | B06B 1/0607 |
| | | | | 310/365 |
| 2018/0018493 | A1 * | 1/2018 | Lin | G06K 9/0002 |

* cited by examiner

ULTRASONIC FINGERPRINT SENSOR AND MANUFACTURING METHOD OF THE SAME

CROSS-REFERENCE TO RELATED APPLICATION

This application claims priority to and the benefit of Chinese Patent Application No. 201610802318.0, and 201621037973.3, both filed with the State Intellectual Property Office of P. R. China on Sep. 5, 2016. The entire contents of the above-identified applications are incorporated herein by reference.

FIELD

The present disclosure relates to a fingerprint sensor technique, and more particularly, to an ultrasonic fingerprint sensor and a manufacturing method of the same.

BACKGROUND

The existing ultrasonic fingerprint sensor includes a piezoelectric post array. Each piezoelectric post is corresponding to a pixel of the ultrasonic fingerprint sensor. The pixel value of the pixel corresponding to fingerprint can be detected by detecting reflected ultrasonic wave sent by each piezoelectric post to finally achieve the fingerprint recognition. The piezoelectric posts need to be processed by microelectromechanical systems. This causes high equipment costs and complicated processes, resulting in high product cost.

SUMMARY

The present disclosure seeks to solve at least one of the problems existing in the related art to at least some extent. Embodiments of the present disclosure provide an ultrasonic fingerprint and a manufacturing method of the same.

According to an embodiment, a manufacturing method of an ultrasonic fingerprint sensor, includes steps of: etching a number of through holes arranged in an array on an insulating substrate to form a frame; filling piezoelectric material into the through holes to form a number of piezoelectric posts corresponding to the number of through holes.

In some embodiments, the method includes at least one of following steps of: forming a number of emitting lines under the frame, each emitting line being connected to one row of the piezoelectric posts; and forming a number of receiving lines above the frame, each receiving line being connected to one column of the piezoelectric posts.

In some embodiments, the method includes at least one of following steps of: forming an upper protective layer covering the receiving lines; forming a lower protective layer covering the emitting lines.

In some embodiments, the method includes steps of: forming a number of wires extending through the frame, each wire being connected to one receiving line; and forming a number of receiving electrodes under the frame, each receiving electrode being connected to one wire.

In some embodiments, the method includes a step of: forming a number of emitting electrodes under the frame, each emitting electrode being connected to one emitting line.

According to an embodiment, an ultrasonic fingerprint sensor includes: a frame, the frame including an insulating substrate, the insulating substrate being etched to form a number of through holes arranged in an array; a number of piezoelectric posts corresponding to the number of through holes, the piezoelectric posts being formed by filling piezoelectric material into the through holes.

In some embodiments, the material of the insulating substrate includes silicon dioxide. In some embodiments, the cross-section of the through hole includes rectangular shape, circular shape or triangular shape.

In some embodiments, the through holes are arranged along a first direction to form a number of rows, and are arranged along a second direction to form a number of columns, and an angle between the first direction and the second direction is a right angle or an acute angle.

In some embodiments, the distance between two adjacent through holes is less than 50 microns.

In some embodiments, the height of the frame is 70-80 microns.

In some embodiments, the piezoelectric material includes piezoelectric ceramic.

In some embodiments, two ends of the piezoelectric post are flush with two opposite surfaces of the frame.

In some embodiments, the ultrasonic fingerprint sensor includes one or more of the following: a number of emitting lines formed under the frame, each emitting line being connected to one row of the piezoelectric posts; and a number of receiving lines formed above the frame, each receiving line being connected to one column of the piezoelectric posts.

In some embodiments, one or more of the following includes silver material: the emitting line and the receiving line.

In some embodiments, a thickness of one or more of the following is 2.5 microns: the emitting line and the receiving line.

In some embodiments, the ultrasonic fingerprint sensor includes one or more of the following: an upper protective layer covering the receiving lines; and a lower protective layer covering the emitting lines.

In some embodiments, one or more of the following includes green paint and silicon dioxide: the upper protective layer and the lower protective layer.

In some embodiments, a thickness of one or more of the following is about 5 microns: the upper protective layer and the lower protective layer.

In some embodiments, the ultrasonic fingerprint sensor includes: a number of wires extending through the frame, each wire being connected to one receiving line; and a number of receiving electrodes formed under the frame, each receiving electrode being connected to one wire.

In some embodiments, the ultrasonic fingerprint sensor includes: a number of emitting electrodes formed under the frame, each emitting electrode being connected to one emitting line.

In the ultrasonic fingerprint sensor and the manufacturing method of the same according to the embodiment of the present disclosure, the frame is formed on the insulating substrate by etching, and the piezoelectric material is filled in the frame to form the piezoelectric posts to form the ultrasonic fingerprint sensor. The cost of the ultrasonic fingerprint sensor can be reduced because the etching apparatus is low-cost and the process is simple.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of embodiments of the present disclosure will become apparent and more readily appreciated from the following descriptions made with reference to the accompanying drawings, in which.

DETAILED DESCRIPTION

Figure 1:
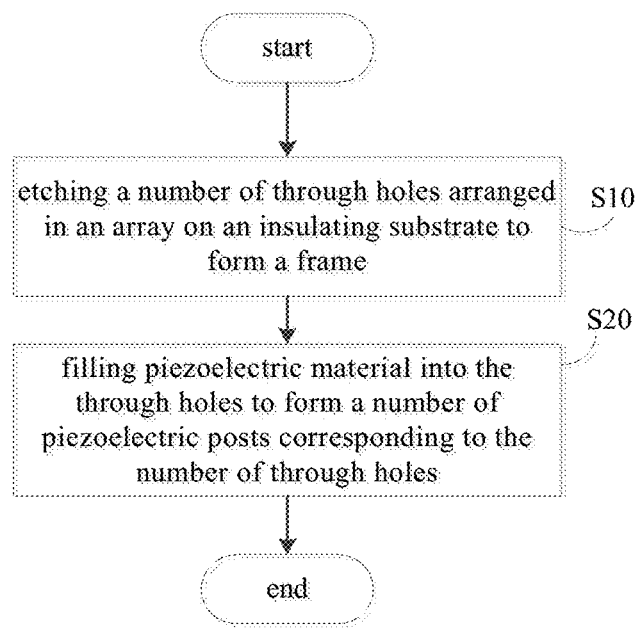
FIG. 1 is a flow chart of a manufacturing method of an ultrasonic fingerprint sensor according to an embodiment of the present disclosure.

Reference will be made in detail to embodiments of the present disclosure. The embodiments described herein with reference to drawings are explanatory, illustrative, and used to generally understand the present disclosure. The embodiments shall not be construed to limit the present disclosure. The same or similar elements and the elements having same or similar functions are denoted by like reference numerals throughout the descriptions.

In the specification, it should be understood that the terms such as "central", "longitudinal", "lateral", "width", "thickness", "above", "below", "front", "rear", "right", "left", "vertical", "horizontal", "top", "bottom", "inner", "outer", "clockwise", "counter-clockwise" should be construed to refer to the orientation as then described or as shown in the drawings. These terms are merely for convenience and concision of description and do not alone indicate or imply that the device or element referred to must have a particular orientation. Thus, it cannot be understood to limit the present disclosure.

In addition, terms such as "first" and "second" are used herein for purposes of description and are not intended to indicate or imply relative importance or significance or impliedly indicate quantity of the technical feature referred to. Thus, the feature formed with "first" and "second" may comprise one or more of these feature. In the description of the present disclosure, "a plurality of" and "a number of" means two or more than two of these features, unless specified otherwise.

In the present disclosure, unless specified or limited otherwise, the terms "mounted," "connected," "coupled," "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Referring to FIG. 1, a manufacturing method of an ultrasonic fingerprint sensor, according to one embodiment of the present disclosure, includes following steps of:

S10: etching a number of through holes 124 arranged in an array on an insulating substrate 122 to form a frame 12;

S20: filling piezoelectric material into the through holes 124 to form a number of piezoelectric posts 14 corresponding to the number of through holes 124.

Figure 2:
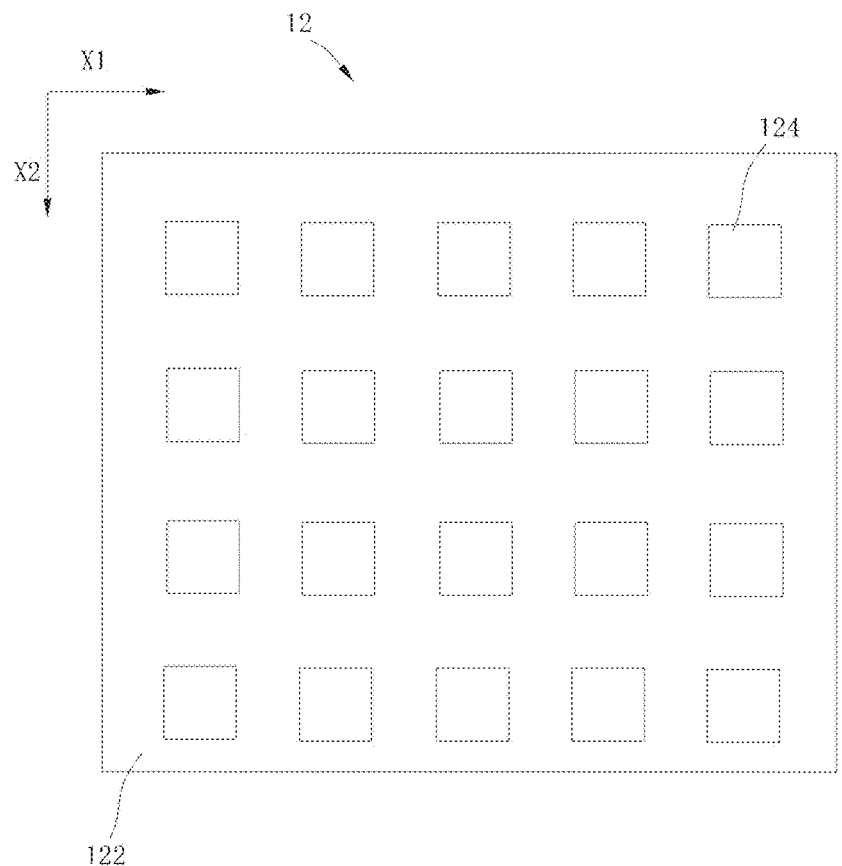
FIG. 2 is a schematic view of a frame according to an embodiment of the present disclosure.
Figure 3:
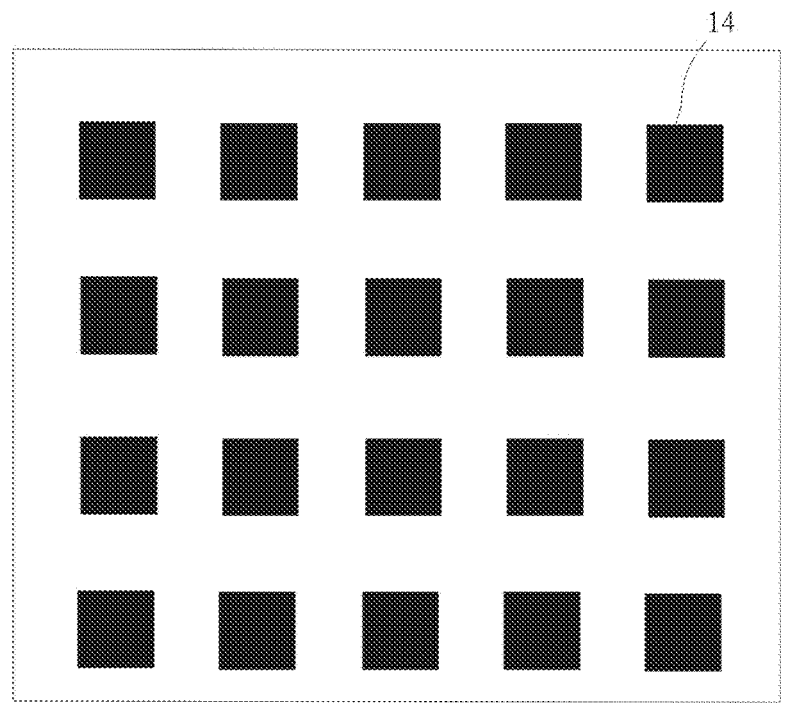
FIG. 3 is a top view of an ultrasonic fingerprint sensor according to an embodiment of the present disclosure.

Referring to FIGS. 2 and 3, the ultrasonic fingerprint sensor 10 includes a frame 12 and a number of piezoelectric posts 14. The frame 12 includes an insulating substrate 122. The insulating substrate 122 is etched to form a number of through holes 124 arranged in an array. The piezoelectric posts 14 are formed by filling piezoelectric material into the through holes 124.

The manufacturing method of the embodiment of the present disclosure can be used for manufacturing the ultrasonic fingerprint sensor 10 of the embodiment of the present disclosure.

In the ultrasonic fingerprint sensor 10 and the manufacturing method of the same according to the embodiment of the present disclosure, the frame 12 is formed on the insulating substrate 122 by etching, and the piezoelectric material is filled in the frame 12 to form the piezoelectric posts 14 to form the ultrasonic fingerprint sensor 10. The cost of the ultrasonic fingerprint sensor 10 can be reduced because the etching apparatus is low-cost and the process is simple.

In some embodiments, the material of the insulating substrate 122 includes silicon dioxide.

Silicon dioxide is semiconductor material, which is suitable for the etching process in semiconductor manufacturing technology. This can make the ultrasonic fingerprint sensor manufacturing method compatible with the semiconductor manufacturing technology, which can further reduce the cost.

It is to be understood that, the insulating substrate 122 may also be other materials having both non-conductive and non-piezoelectric properties, which is not limited in the embodiment of the present disclosure. For example, the material of the insulating substrate 122 may be a vinyl material, for example, a vinyl epoxy resin. Vinyl epoxy resin is insulation material, which has a good temperature resistance and solvent resistance, and has bright surfaces and strong bonding strength after curing. Thus, good connections between the piezoelectric posts 14 can be achieved by the vinyl material.

Figure 4:
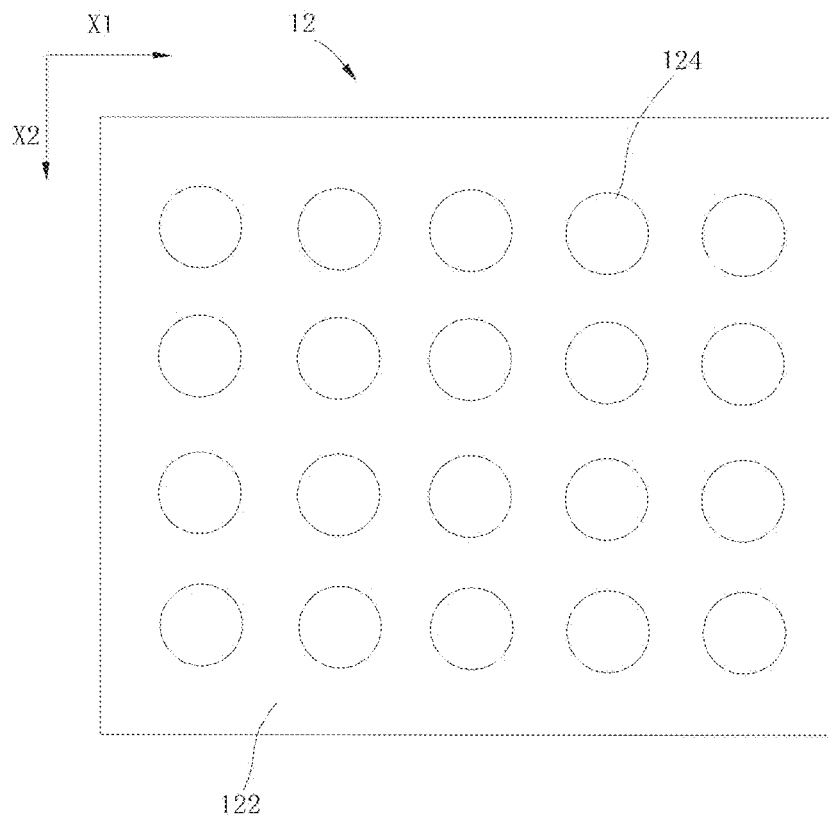
FIG. 4 is a top view of a frame according to an embodiment of the present disclosure.

Please referring to FIGS. 2 and 4, in some embodiments, the cross-section of the through hole 124 can be rectangular shape, circular shape, triangular shape or other polygon shapes.

Therefore, it is easy to design and manufacture by using regular geometry.

It is to be understood that, since the piezoelectric post 14 is formed by filling the piezoelectric material into the through hole 124, the cross-section of the piezoelectric post 14 corresponds to the cross-section of the through hole 124. That is, the cross-section of the piezoelectric posts 14 may also include rectangular shape, circular shape, triangular shape or other polygon shapes.

When the ultrasonic fingerprint sensor 10 is in operation, the ultrasonic waves formed by the piezoelectric post 14 are emitted in various directions. The ultrasonic waves include longitudinal waves and lateral waves. The longitudinal wave is the effective wave used by the ultrasonic fingerprint sensor 10, and the lateral wave is the interference wave that generates noise interference. The feedback signals formed by the lateral waves of the ultrasonic waves impacting different piezoelectric posts 14 along the cross-section direction of the piezoelectric post 14 are different, which result in different noises. According to the application, such as a certain type of a sensor, the shape of the piezoelectric post 14 can be selected correspondingly to reduce the lateral noise of the ultrasonic wave.

Figure 5:
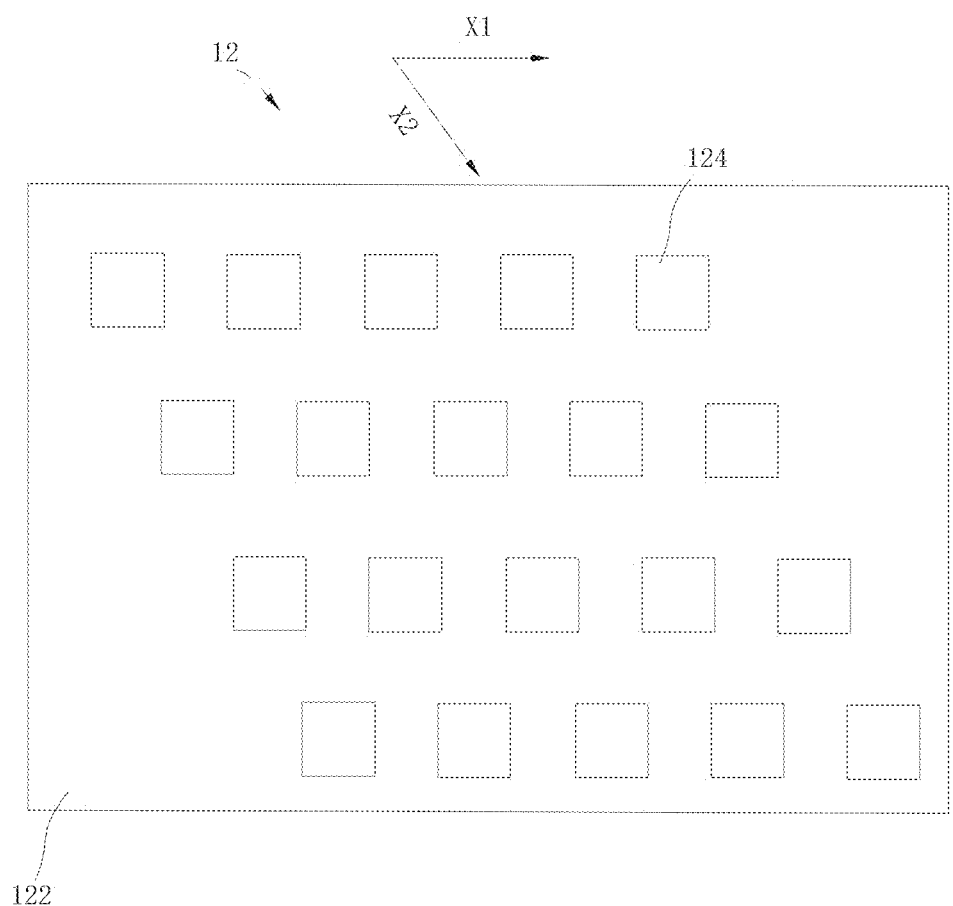
FIG. 5 is a top view of a frame according to an embodiment of the present disclosure.

Referring to FIGS. 2, 4 and 5, in some embodiments, the through holes 124 in the ultrasonic fingerprint sensor 10 are arranged along a first direction X1 to form a number of rows, and are arranged along a second direction X2 to form a number of columns, and an angle between the first direction X1 and the second direction X2 is a right angle, as shown in FIGS. 2 and 4, or an acute angle, as shown in FIG. 5.

When the angle between the first direction X1 and the second direction X2 is a right angle, the through holes 124 are arranged in a right array. The arrangement is regular and is easy to design and manufacture.

When the angle between the first direction X1 and the second direction X2 is an acute angle, the through holes 124 are arranged in an oblique array, or in other words, the through holes 124 in different rows are misaligned. In this way, a through hole 124 in a different row can be arranged in the space between the two adjacent through holes 124 in the same row by the compressing row pitch. That is, the distance between the two adjacent rows of the through holes 124 is smaller than the distance between the two adjacent through holes in the same row, thereby increasing the space utilization and the density of the through holes 124.

In some embodiments, the distance between the two adjacent through holes 124 is less than 50 microns.

In this way, the sampling resolution of the ultrasonic fingerprint sensor 10 can be larger than 508 DPI (dots per inch, the number of dots printed per inch). When the distance between the two adjacent through holes 124 is greater than 50 microns, the sampling resolution will be reduced. In some embodiments, the distance between the two adjacent through holes 124 means the maximum distance between the two adjacent through holes 124.

In some embodiments, the height of the frame 12 is 70-80 microns.

It is to be understood that, the piezoelectric post 14 corresponding to the through hole 124 means that the shape and size of the piezoelectric post 14 are substantially the same as those of the through hole 124. Since the piezoelectric post 14 is formed by filling piezoelectric material into the through hole 124, the shape of the piezoelectric post 14 is the same as that of the through hole 124, and the size of the piezoelectric post 14 is the same as that of the through hole 124 too.

Accordingly, the thickness of the piezoelectric post 14 is 70 to 80 microns. The vibration frequency of the ultrasonic fingerprint sensor 10 is inversely proportional to the thickness of the piezoelectric post 14, and the acoustic wave emitted by the piezoelectric post 14 having a thickness of 70 to 80 microns is the ultrasonic wave and is non-destructive to the human body. It is noted that, the thickness of the piezoelectric post 14 may also be changed for different design requirements.

In some embodiments, the piezoelectric material includes piezoelectric ceramic.

Therefore, the ultrasonic wave is received by the use of positive piezoelectric effect of the piezoelectric ceramic, and the ultrasonic wave is emitted by the use of inverse piezoelectric effect of the piezoelectric ceramic. The piezoelectric ceramics have stable performance in temperature, excellent electrical properties and vibration stability. The manufacture of the piezoelectric ceramics is simple, and it is easy to obtain raw material and the row material is inexpensive. With the use of piezoelectric ceramics as a piezoelectric material, the stability of the piezoelectric post 14 of the ultrasonic fingerprint sensor 10 can be ensured, and the manufacturing cost can be reduced.

In some embodiments, two ends of the piezoelectric post 14 are flush with two opposite surfaces of the frame 12.

Specifically, filling the piezoelectric material may be carried out on a flat substrate (not shown), and generally it is also necessary to press the piezoelectric material, for example, using a flat pressing plate to press. In this way, two ends of the piezoelectric post 14 are parallel and flush with two opposite surfaces of the frame 12. Further, the process of grinding and the like may be performed after filling to make sure the flatness of two ends of the piezoelectric post 14 and the two opposite surfaces of the frame 12. Therefore, it is good for the following wiring and other processes.

Figure 6:
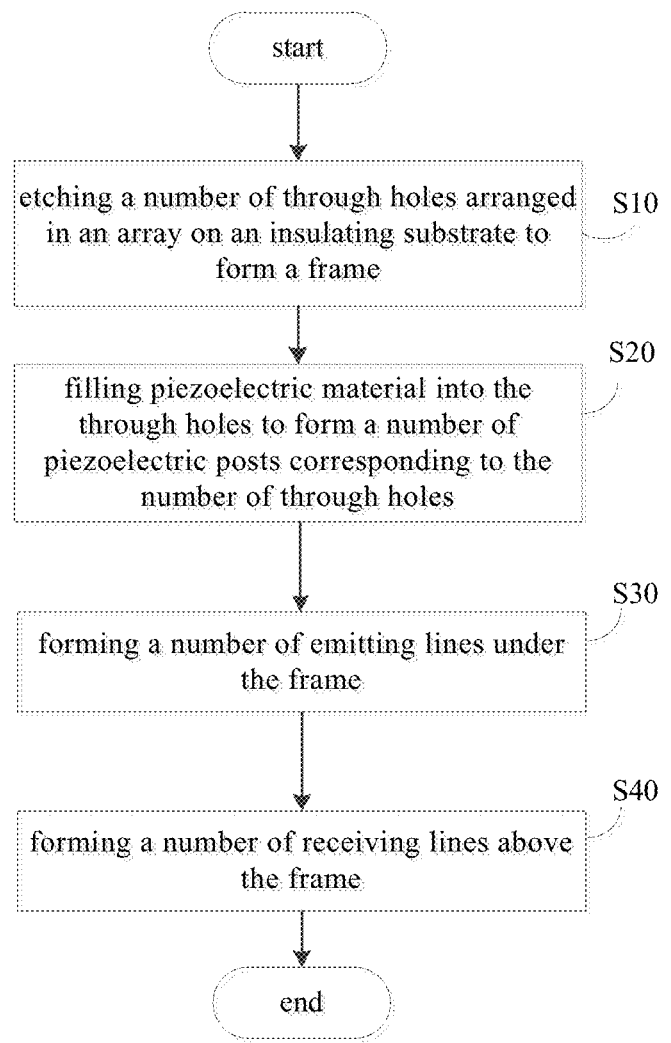
FIG. 6 is a flow chart of a manufacturing method of an ultrasonic fingerprint sensor according to an embodiment of the present disclosure.

Referring to FIG. 6, in some embodiments, the manufacturing method of an ultrasonic fingerprint sensor includes following steps of:

S30: forming a number of emitting lines 16 under the frame, each emitting line 16 being connected to one row of the piezoelectric posts 14; and S40: forming a number of receiving lines 18 above the frame, each receiving line 18 being connected to one column of the piezoelectric posts 14.

Figure 9:
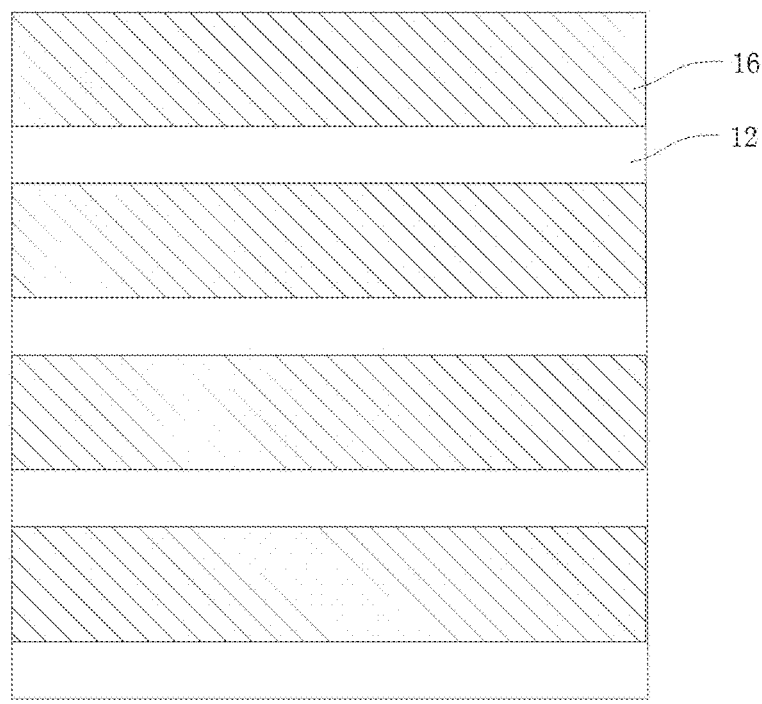
FIG. 9 is a schematic view of an ultrasonic fingerprint sensor according to an embodiment of the present disclosure.
Figure 10:
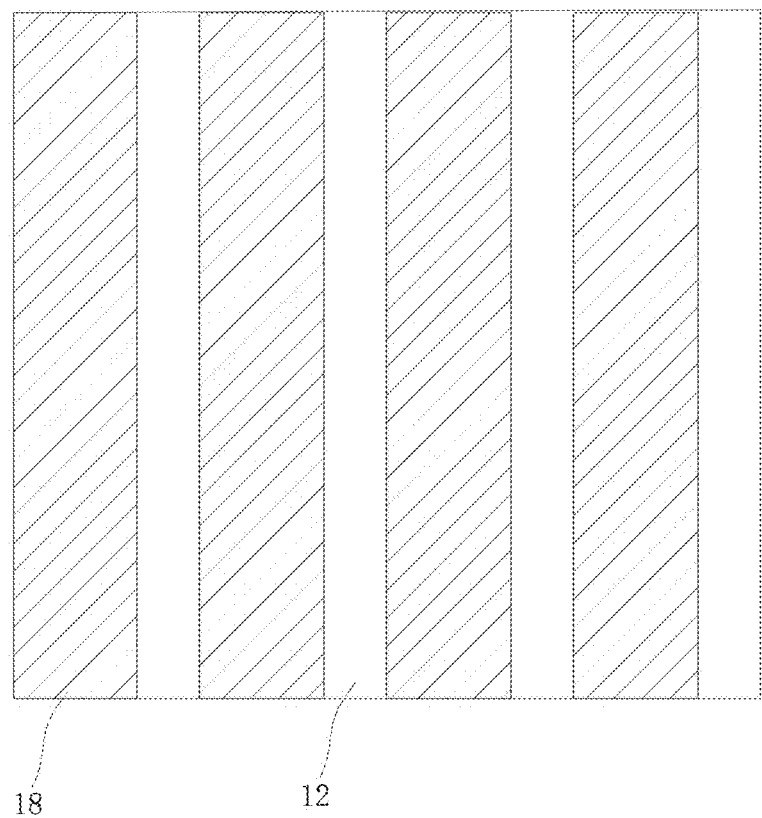
FIG. 10 is a schematic view of an ultrasonic fingerprint sensor according to an embodiment of the present disclosure.

Referring to FIGS. 9 and 10, in some embodiments, when the piezoelectric posts 14 are arranged in an m*n array, one receiving line 18 is formed on the upper surfaces of piezoelectric posts 14 in each column, that is, there are n receiving lines 18 above the frame 12. One emitting line 16 is formed on the lower surfaces of piezoelectric posts 14 in each row, that is, there are m emitting lines 16 under the frame 12.

In the embodiment of the present disclosure, the emitting lines 16 are spaced from each other and are formed on the lower surface 121 of the frame 12. The receiving lines 18 are spaced from each other and are formed on the upper surface 122 of the frame 12.

It is noted that, the emitting line 16 needs to cross over the receiving line 18, that is, the emitting line 16 is not parallel with the receiving line 18. In some embodiments, for example, when the through holes 124 in FIG. 2 are used, the emitting line 16 is provided at a right angle to the receiving line 18. When the through holes 124 in FIG. 5 are used, the emitting line 16 is provided at an acute angle to the receiving line 18.

In this way, the emitting line 16 and the receiving line 18 intersect each other and correspond to one the piezoelectric post 14. The intersection between the emitting line 16 and the receiving line 18 forms a pixel of the ultrasonic fingerprint sensor 10 to detect the outline of the object which is close to the piezoelectric post 14 or contact with the piezoelectric post 14.

Figure 7:
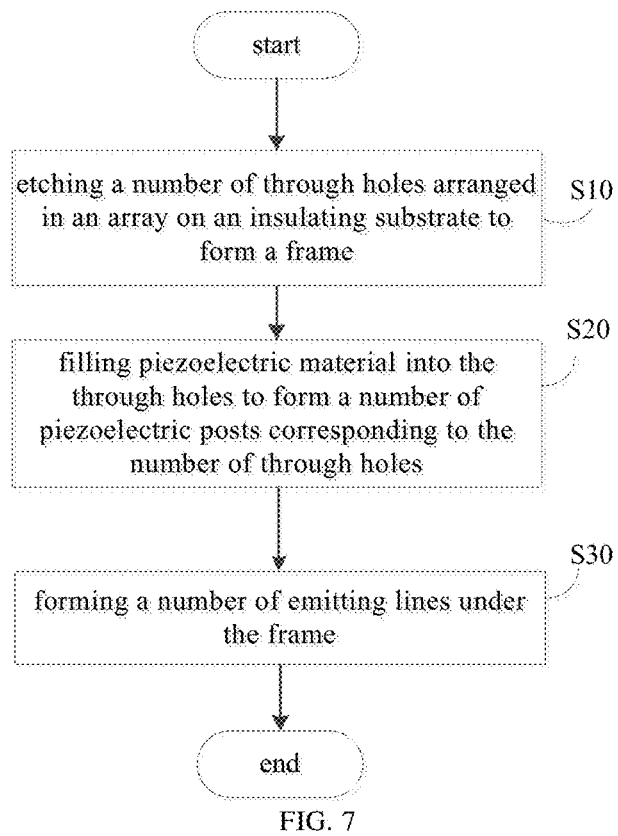
FIG. 7 is a flow chart of a manufacturing method of an ultrasonic fingerprint sensor according to an embodiment of the present disclosure.
Figure 8:
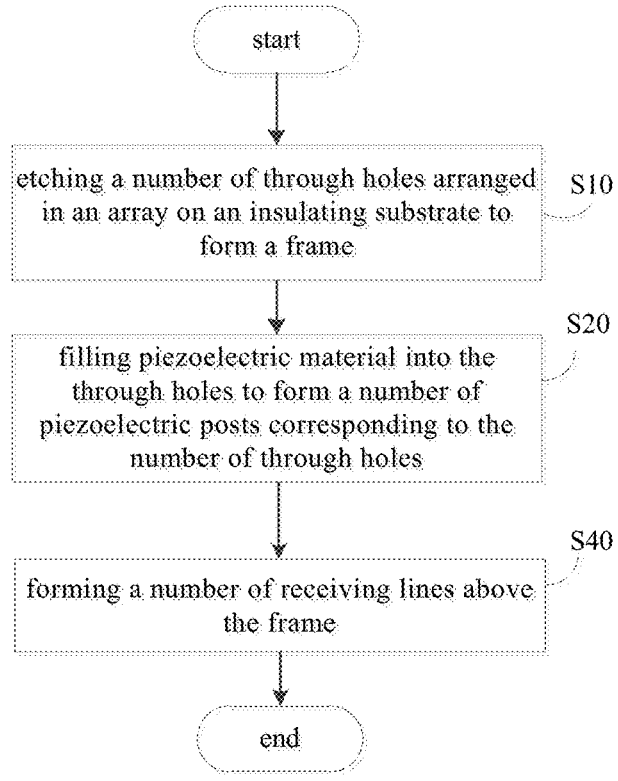
FIG. 8 is a flow chart of a manufacturing method of an ultrasonic fingerprint sensor according to an embodiment of the present disclosure.

It is to be understood that, in one embodiment, the manufacturing method of an ultrasonic fingerprint sensor includes a step of: S30: forming a number of emitting lines under the frame, each emitting line being connected to one row of the piezoelectric posts, as shown in FIG. 7. In another embodiment, the manufacturing method of an ultrasonic fingerprint sensor includes a step of: S40: forming a number of receiving lines above the frame, each receiving line being connected to one column of the piezoelectric posts, as shown in FIG. 8.

In some embodiments, the emitting line 16 includes silver material, and/or the receiving line 18 includes silver material. That is, in one embodiment, the emitting line 16 and the receiving line 18 include silver material. In another embodiment, the emitting line 16 or the receiving line 18 includes silver material.

In some embodiments, the emitting line 16 and the receiving line 18 are formed by a sputtering process.

The sputtering process uses electrons or high-energy lasers to bombard the target and sputter the surface components of the target in atomic or ionic form. The surface components of the target eventually deposit on the substrate surface and undergo a film formation process, and finally form a film.

In some embodiments, silver is used as the target. The receiving line 18 above the frame 12 and the emitting line 16 under the frame 12 are formed by the sputtering process.

In some embodiments, the thickness of the emitting line 16 is 2.5 microns and/or the thickness of the receiving line 18 is 2.5 microns.

In this way, the thicknesses of the receiving line 18 and the emitting line 16 can meet the process requirements to ensure good electrical performance.

In one embodiment, the thickness of the emitting line 16 is 2.5 microns and the thickness of the receiving line 18 is 2.5 microns. In another embodiment, the thickness of the emitting line 16 is 2.5 microns or the thickness of the receiving line 18 is 2.5 microns.

Figure 11:
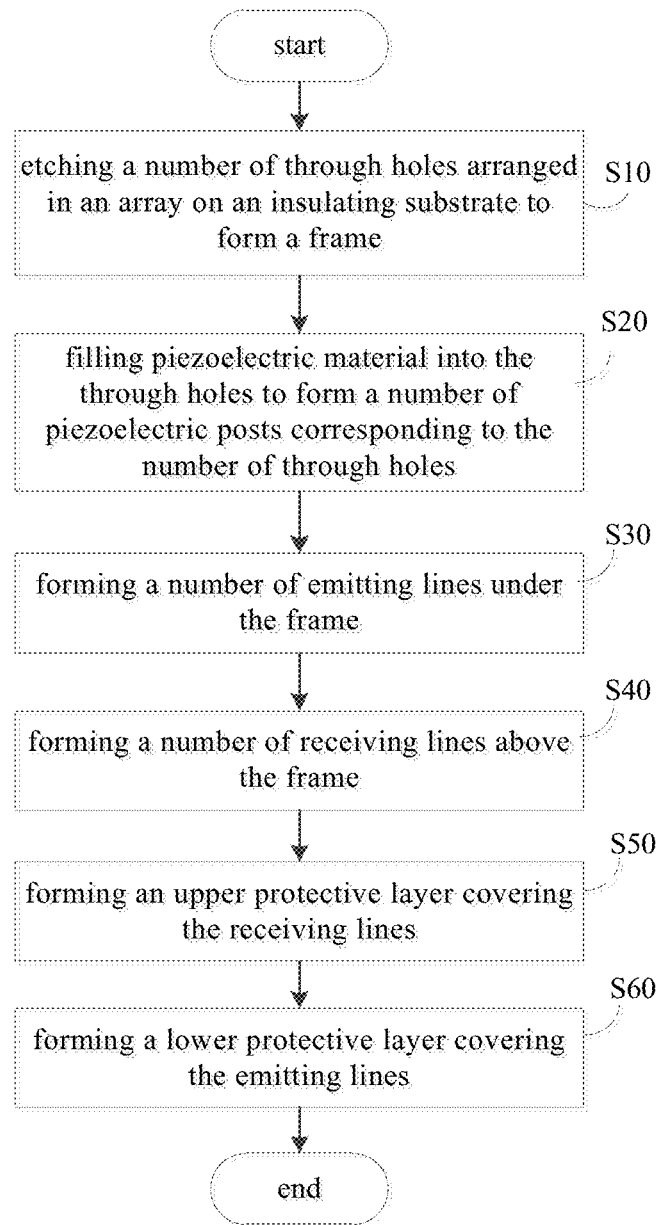
FIG. 11 is a flow chart of a manufacturing method of an ultrasonic fingerprint sensor according to an embodiment of the present disclosure.

Referring to FIG. 11, in some embodiments, the manufacturing method of an ultrasonic fingerprint sensor includes following steps of: S50: forming an upper protective layer 13 covering the receiving lines 18;

S60: forming a lower protective layer 11 covering the emitting lines 16.

Figure 12:
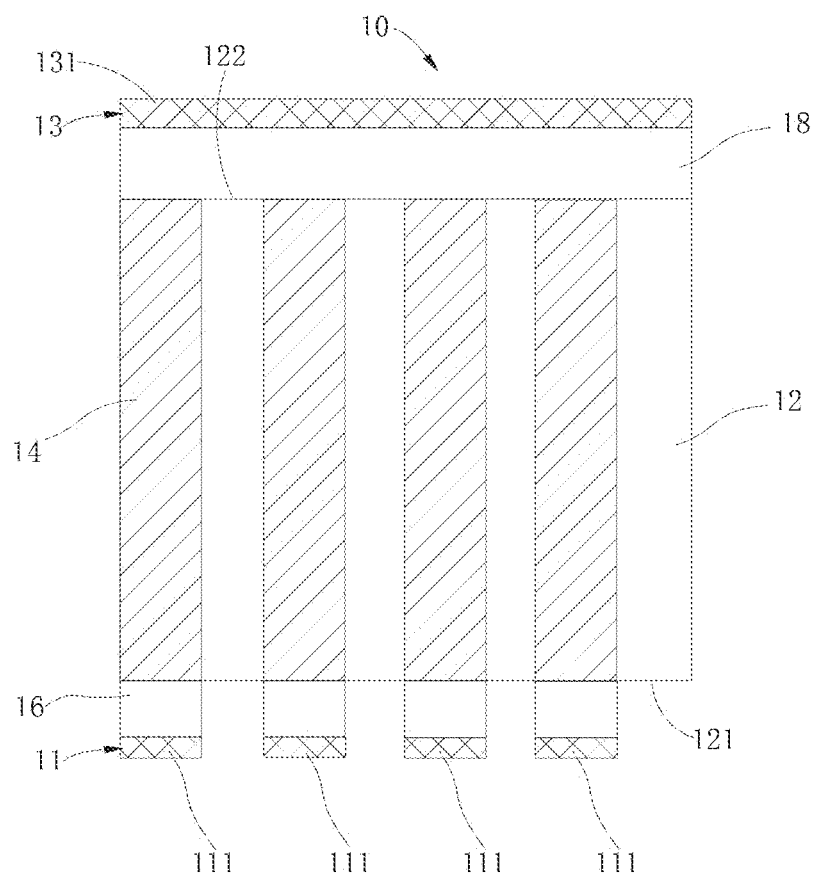
FIG. 12 is a schematic view of an ultrasonic fingerprint sensor according to an embodiment of the present disclosure.

Referring to FIG. 12, in some embodiments, the ultrasonic fingerprint sensor 10 includes an upper protective layer 13 covering the receiving line 18 and a lower protective layer 11 covering the emitting line 16.

In this way, the design of the protective layer will be able to protect the electrode lines, thus ensuring the electrical performance of the ultrasonic fingerprint sensor 10.

In FIG. 12, the upper protective layer 13 includes a number of sub upper protective layers 131 covering the receiving lines 18 respectively. The lower protective layer 11 includes a number of sub lower protective layers 111 covering the emitting lines 16 respectively.

In one embodiment, the manufacturing method of an ultrasonic fingerprint sensor includes following steps of: S50: forming an upper protective layer covering the receiving lines. In another embodiment, the manufacturing method of an ultrasonic fingerprint sensor includes following steps of: S60: forming a lower protective layer covering the emitting lines.

In one embodiment, the ultrasonic fingerprint sensor 10 includes the upper protective layer 13 covering the receiving line 18. In another embodiment, the ultrasonic fingerprint sensor 10 includes the lower protective layer 11 covering the emitting line 16.

In some embodiments, the upper protective layer 13 includes green paint and silicon dioxide, and/or the lower protective layer 11 includes green paint and silicon dioxide.

That is, in one embodiment, the upper protective layer 13 includes green paint and silicon dioxide, and the lower protective layer 11 includes green paint and silicon dioxide. In another embodiment, the upper protective layer 13 includes green paint and silicon dioxide, or the lower protective layer 11 includes green paint and silicon dioxide.

In some embodiments, the thickness of the upper protective layer 13 is about 5 microns and/or the thickness of the lower protective layer 11 is about 5 microns. That is, in one embodiment, the thickness of the upper protective layer 13 is about 5 microns and the thickness of the lower protective layer 11 is about 5 microns. In another embodiments, the thickness of the upper protective layer 13 is about 5 microns or the thickness of the lower protective layer 11 is about 5 microns.

Figure 13:
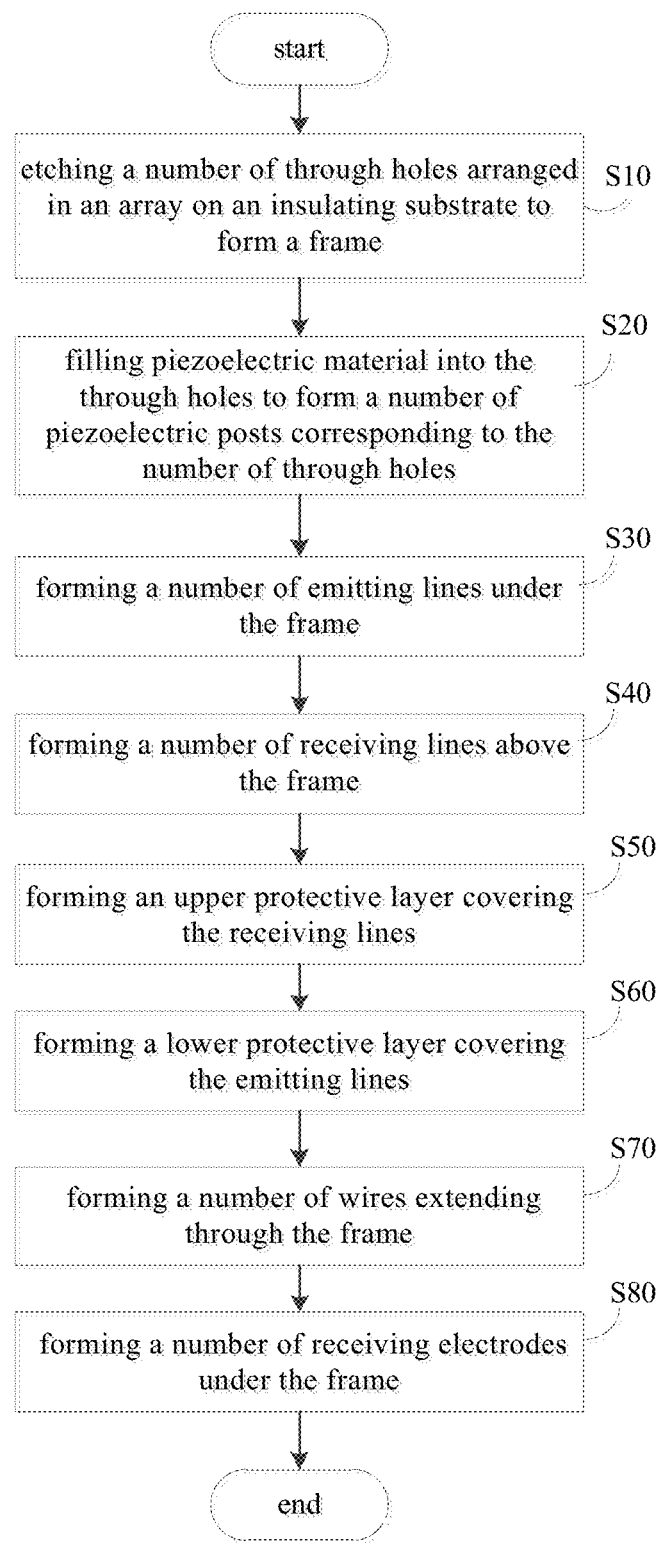
FIG. 13 is a flow chart of a manufacturing method of an ultrasonic fingerprint sensor according to an embodiment of the present disclosure.

Referring to FIG. 13, in some embodiments, the manufacturing method of an ultrasonic fingerprint sensor includes following steps of:

S70: forming a number of wires 17 extending through the frame 12, each wire 17 being connected to one receiving line 18; and S80: forming a number of receiving electrodes 19 under the frame 12, each receiving electrode 19 being connected to one wire 17.

Figure 14:
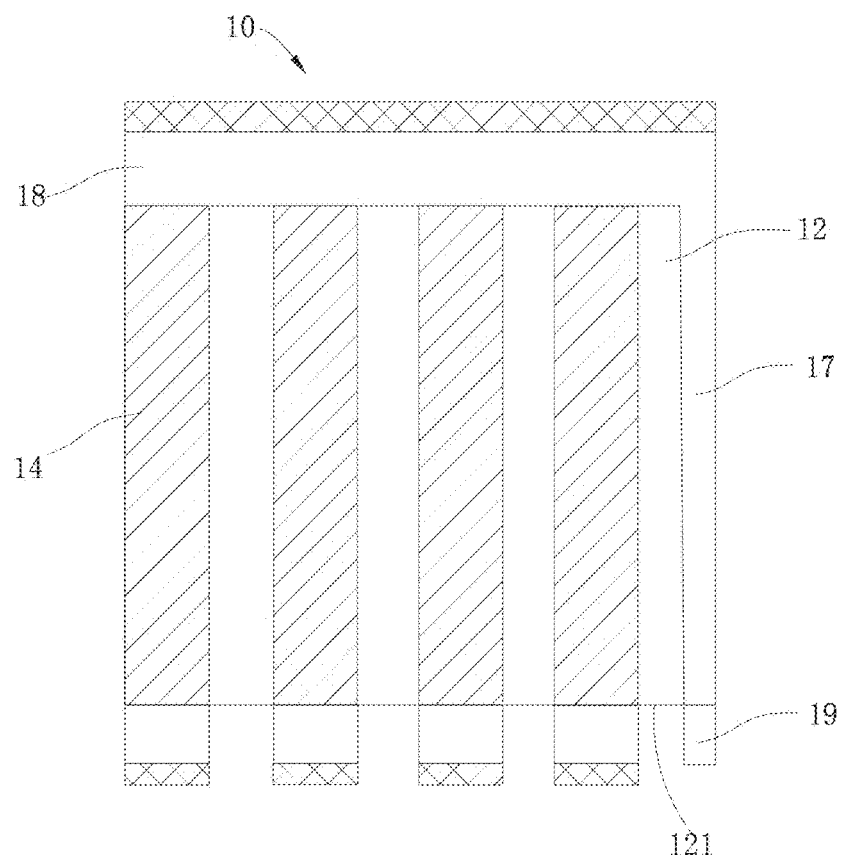
FIG. 14 is a schematic view of an ultrasonic fingerprint sensor according to an embodiment of the present disclosure.

Please referring to FIG. 14, in some embodiments, the ultrasonic fingerprint sensor 10 includes:

a number of wires 17 extending through the frame 12, each wire 17 being connected to one receiving line 18; and a number of receiving electrodes 19 formed under the frame 12, each receiving electrode 19 being connected to one wire 17.

In the embodiment of the present disclosure, the receiving electrodes 19 are formed on the lower surface 121 of the frame 12.

It is noted that, since one side of the receiving line 18 is required to be connected, or one end of each receiving line 18 is selected as a contact, the portion of the frame 12 to be perforated can be selected according to the actual position of the contact during the forming of the wire 17. For example, the perforations may be performed at opposite sides of the frame 12, or the perforations may be performed at one side of the array, or at other positions of the frame 12.

Figure 15:
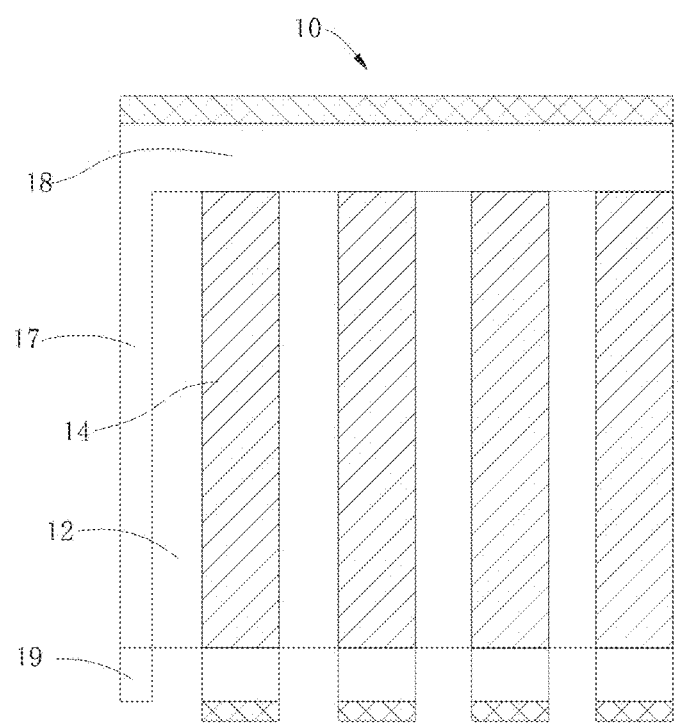
FIG. 15 is a schematic view of an ultrasonic fingerprint sensor according to an embodiment of the present disclosure.
Figure 16:
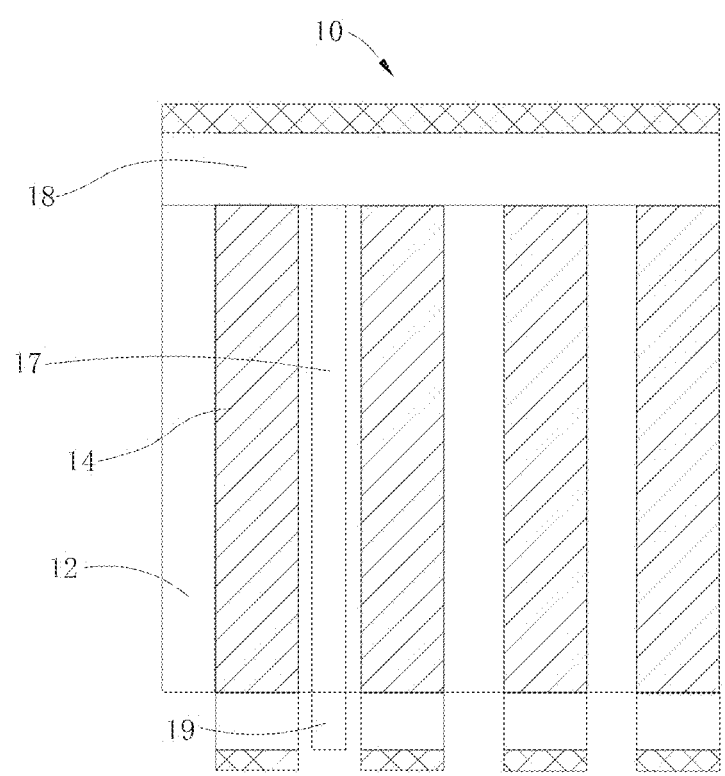
FIG. 16 is a schematic view of an ultrasonic fingerprint sensor according to an embodiment of the present disclosure.

For example, in the embodiment in FIG. 14, the perforated portions of the frame 12 are at right side of the frame 12. In the embodiment of FIG. 15, the perforated portions of the frame 12 are at left side of the frame 12. In the embodiment of FIG. 16, the perforated portions of the frame 12 are between two adjacent through holes 124. It is to be understood that, other locations of the perforated portions of the frame 12 can be achieved according to the above illustrated embodiments. For example, some of the perforated portions of the frame 12 are at right side of the frame 12 and some of the perforated portions of the frame 12 are at left side of the frame 12.

In some embodiments, the wire 17 is formed using an electroplating silver process so that the receiving line 18 above the frame 12 can be connected to another side of the frame 12 through the wire 17 and the receiving electrode 19 can be formed under the perforated portion of the frame 12.

It is noted that, the emitting line 16 is omitted at the perforated portion of the frame 12 to prevent the short circuit between electrode lines, for example, between the emitting line 16 and the receiving line 18.

In one embodiment, the manufacturing method of an ultrasonic fingerprint sensor includes following a step of: S70: forming a number of wires extending through the frame, each wire being connected to one receiving line. In another embodiment, the manufacturing method of an ultrasonic fingerprint sensor includes following a step of: S80: forming a number of receiving electrodes under the frame, each receiving electrode being connected to one wire.

Figure 17:
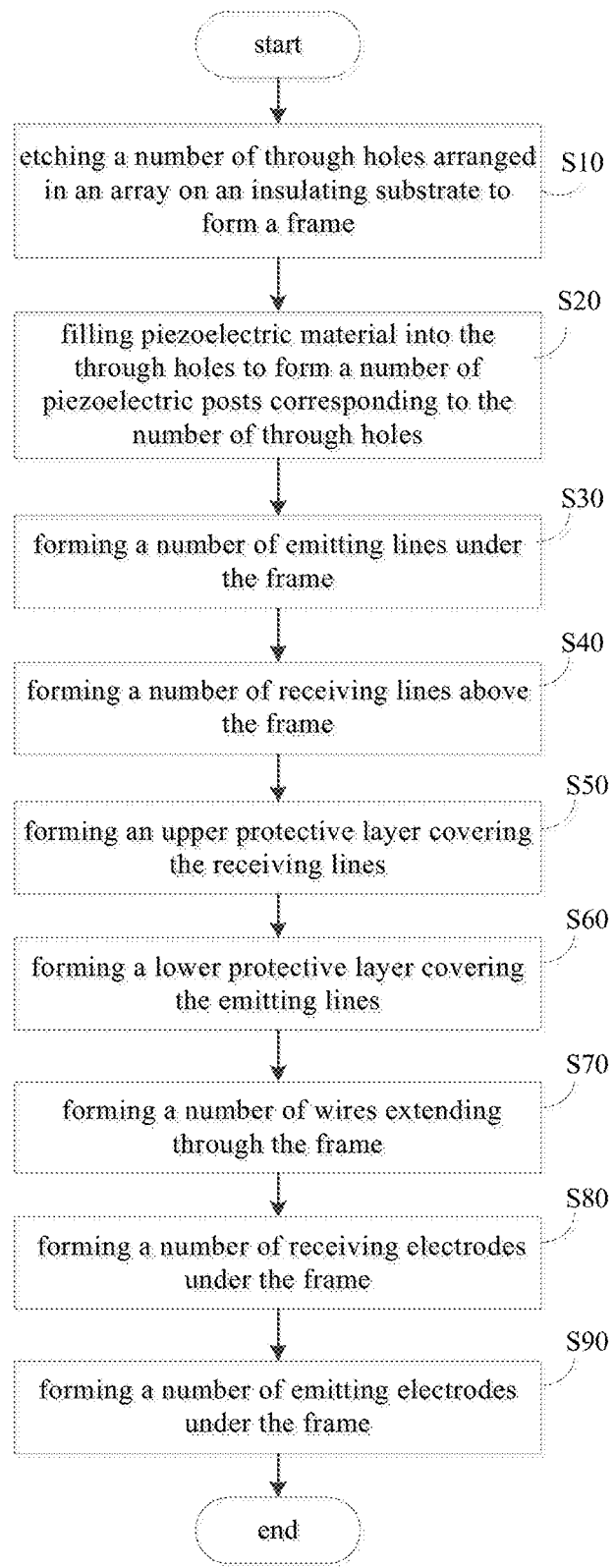
FIG. 17 is a flow chart of a manufacturing method of an ultrasonic fingerprint sensor according to an embodiment of the present disclosure.

Please referring to FIG. 17, in some embodiments, the manufacturing method of an ultrasonic fingerprint sensor includes a step of:

S90: forming a number of emitting electrodes 15 under the frame 12, each emitting electrode 15 being connected to one emitting line 16.

Figure 18:
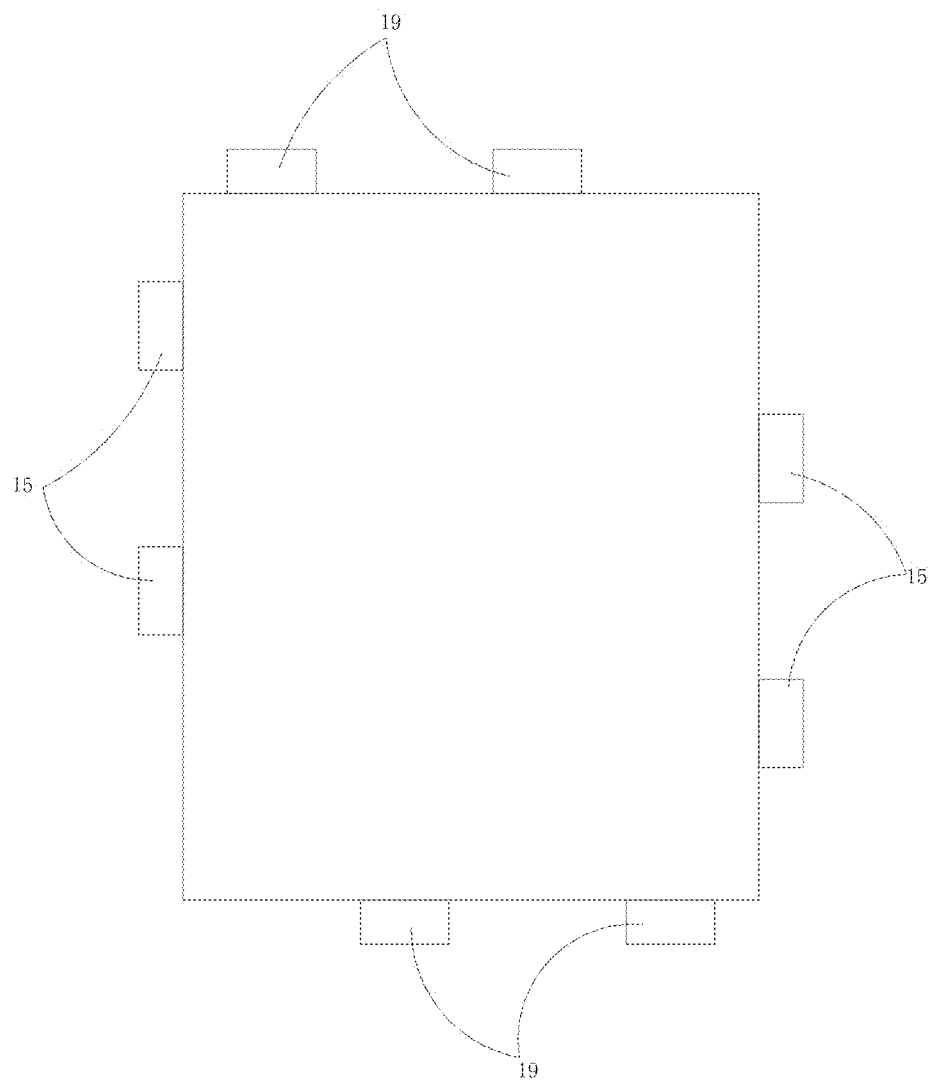
FIG. 18 is a schematic view of an ultrasonic fingerprint sensor according to an embodiment of the present disclosure.

Please referring to FIG. 18, in some embodiments, the ultrasonic fingerprint sensor 10 includes:

a number of emitting electrodes 15 formed under the frame 12, each emitting electrode 15 being connected to one emitting line 16.

Similar to the receiving line 18, the emitting line 16 also requires one end to be connected, so that either end of the emitting line 16 can be selected to be connected the emitting electrode 15. In some embodiments, the emitting electrode 15 can be one end of the emitting electrode. For example, the end of the emitting line 16 protruding from the frame 12 can be the emitting electrode 15.

When the ultrasonic fingerprint sensor 10 is in operation, the finger is pressed against the ultrasonic fingerprint sensor 10, a high frequency alternating voltage is applied to the emitting electrode 15. The receiving electrode 19 is grounded and the corresponding piezoelectric post 12 undergoes high-frequency fluctuation deformation and converts the electric energy into mechanical energy to emit ultrasonic waves. Then, the emitting electrode 15 is grounded and the receiving electrode 19 is connected to a signal reading device (not shown). After reflected by the finger, the ultrasonic wave returns to the piezoelectric post 14. The piezoelectric post 14 converts the mechanical energy into the electrical energy. A voltage is formed between the two ends of the piezoelectric post 14, which is the voltage of the receiving electrode 19. Thus, the ultrasonic fingerprint sensor 10 can read the voltage to identify the depth of one point corresponding to the finger.

It is noted that, since the ultrasonic fingerprint sensor 10 needs to be electrically connected to the corresponding contact on the circuit board through the contact in the subsequent packaging process, the protective layer may be not cover the emitting electrode 15 and the receiving electrode 19.

Reference throughout this specification to "an embodiment," "one embodiment," "another embodiment," "some embodiments," "an illustrated embodiment", "an example," "a specific example," or "some examples," means that a particular feature, structure, material, or characteristic described in connection with the embodiment or example is included in at least one embodiment or example of the present disclosure. The schematic expressions of the above-mentioned phrases throughout this specification are not necessarily referring to the same embodiment or example of the present disclosure. Furthermore, the particular features, structures, materials, or characteristics can be combined in any suitable manner in any one or more embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from scope of the present disclosure.

What is claimed is:

1. A manufacturing method of an ultrasonic fingerprint sensor, comprising steps of:
    etching a plurality of through holes arranged in an array on an insulating substrate to form a frame;
    filling piezoelectric material into the through holes to form a plurality of piezoelectric posts corresponding to the plurality of through holes;
    forming a plurality of emitting lines under the frame, each emitting line being connected to one row of the piezoelectric posts;
    forming a plurality of receiving lines above the frame, each receiving line being connected to one column of the piezoelectric posts;
    forming a plurality of wires extending through the frame, each wire being connected to one receiving line; and
    forming a plurality of receiving electrodes under the frame, each receiving electrode being connected to one wire.

2. The method of claim 1, comprising at least one of following steps of:
    forming an upper protective layer covering the receiving lines;
    forming a lower protective layer covering the emitting lines.

3. The method of claim 1, comprising a step of:
    forming a plurality of emitting electrodes under the frame, each emitting electrode being connected to one emitting line.

4. An ultrasonic fingerprint sensor, comprising:
    a frame, the frame comprising an insulating substrate, the insulating substrate being etched to form a plurality of through holes arranged in an array;

a plurality of piezoelectric posts corresponding to the plurality of through holes, the piezoelectric posts being formed by filling piezoelectric material into the through holes;

a plurality of emitting lines formed under the frame, each emitting line being connected to one row of the piezoelectric posts; and a plurality of receiving lines formed above the frame, each receiving line being connected to one column of the piezoelectric posts;

a plurality of wires extending through the frame, each wire being connected to one receiving line; and a plurality of receiving electrodes formed under the frame, each receiving electrode being connected to one wire.

5. The ultrasonic fingerprint sensor of claim 4, wherein the material of the insulating substrate comprises silicon dioxide.

6. The ultrasonic fingerprint sensor of claim 4, wherein the cross-section of the through hole comprises rectangular shape, circular shape or triangular shape.

7. The ultrasonic fingerprint sensor of claim 4, wherein the through holes are arranged along a first direction to form a plurality of rows, and are arranged along a second direction to form a plurality of columns, and an angle between the first direction and the second direction is a right angle or an acute angle.

8. The ultrasonic fingerprint sensor of claim 4, wherein the distance between two adjacent through holes is less than 50 microns.

9. The ultrasonic fingerprint sensor of claim 4, wherein the height of the frame is 70-80 microns.

10. The ultrasonic fingerprint sensor of claim 4, wherein the piezoelectric material comprises piezoelectric ceramic.

11. The ultrasonic fingerprint sensor of claim 4, wherein two ends of the piezoelectric post are flush with two opposite surfaces of the frame.

12. The ultrasonic fingerprint sensor of claim 4, wherein one or more of the following comprises silver material: the emitting line and the receiving line.

13. The ultrasonic fingerprint sensor of claim 4, wherein a thickness of one or more of the following is 2.5 microns: the emitting line and the receiving line.

14. The ultrasonic fingerprint sensor of claim 4, comprising one of more of the following:
    an upper protective layer covering the receiving lines; and
    a lower protective layer covering the emitter lines.

15. The ultrasonic fingerprint sensor of claim 14, wherein one or more of the following comprises green paint and silicon dioxide: the upper protective layer and the lower protective layer.

16. The ultrasonic fingerprint sensor of claim 14, wherein a thickness of one or more of the following is about 5 microns: the upper protective layer and the lower protective layer.

17. The ultrasonic fingerprint sensor of claim 4, comprising:
    a plurality of emitting electrodes formed under the frame, each emitting electrode being connected to one emitting line.

18. A manufacturing method of an ultrasonic fingerprint sensor, comprising steps of:
    etching a plurality of through holes arranged in an array on an insulating substrate to form a frame;
    filling piezoelectric material into the through holes to form a plurality of piezoelectric posts corresponding to the plurality of through holes;
    forming a plurality of emitting lines under the frame, each emitting line being connected to one row of the piezoelectric posts;
    forming a plurality of receiving lines above the frame, each receiving line being connected to one column of the piezoelectric posts; and
    forming a plurality of emitting electrodes under the frame, each emitting electrode being connected to one emitting line.

* * * * *